(12) United States Patent
Tagansky et al.

(10) Patent No.: US 8,259,770 B2
(45) Date of Patent: Sep. 4, 2012

(54) LASER ARRAY

(75) Inventors: Boaz Tagansky, Rishon Letzion (IL); Michael Plotkin, Rehovot (IL); Craig Breen, Rehovot (IL)

(73) Assignee: Hewlett-Packard Indigo B.V., Maastricht (NL)

( * ) Notice: Subject to any disclaimer, the term of this patent is extended or adjusted under 35 U.S.C. 154(b) by 480 days.

(21) Appl. No.: 12/577,201

(22) Filed: Oct. 11, 2009

(65) Prior Publication Data

US 2011/0085014 A1  Apr. 14, 2011

(51) Int. Cl.
- *H01S 3/04* (2006.01)
- *H01S 5/00* (2006.01)
- *B41J 2/385* (2006.01)
- *B41J 2/435* (2006.01)
- *G01D 15/06* (2006.01)
- *G03G 15/01* (2006.01)

(52) U.S. Cl. .................. 372/50.12; 372/34; 372/50.122; 347/119; 347/247

(58) Field of Classification Search .................... 372/34, 372/38.02, 38.07, 50.12, 50.122, 50.124; 347/118, 119, 128, 129, 130, 132, 133, 233, 347/247

See application file for complete search history.

(56) References Cited

U.S. PATENT DOCUMENTS

| | | | |
|---|---|---|---|
| 4,761,659 A * | 8/1988 | Negishi | 347/247 |
| 4,870,652 A | 9/1989 | Thornton | |
| 5,151,391 A | 9/1992 | Fu et al. | |
| 5,151,915 A | 9/1992 | Paoli | |
| 5,497,391 A | 3/1996 | Paoli | |
| 5,515,391 A * | 5/1996 | Endriz | 372/34 |
| 6,553,044 B1 * | 4/2003 | Eden | 372/38.02 |
| 7,355,765 B2 * | 4/2008 | Yoshida | 358/501 |
| 7,505,495 B2 | 3/2009 | Fratti et al. | |
| 8,188,670 B2 * | 5/2012 | Yasuda | 315/192 |
| 2005/0169327 A1 | 8/2005 | Eden et al. | |
| 2005/0249509 A1 | 11/2005 | Nagarajan et al. | |

* cited by examiner

*Primary Examiner* — Uyen Chau N Le
*Assistant Examiner* — John M Bedtelyon
(74) *Attorney, Agent, or Firm* — Jan Frankhuizen

(57) ABSTRACT

Electrophotographic print system, comprising a photosensitive medium, and a laser array being provided with a plurality of laser diodes arranged to emit light onto the photosensitive medium for varying an electrical potential on a surface of the photosensitive medium, and a plurality of heat dissipation diodes, each heat dissipation diode being arranged in proximity to a corresponding laser diode, wherein each laser diode and the corresponding heat dissipation diode are coupled to a common drive circuit and are arranged in opposite current flow directions with respect to each other, so that in use the current flows either through the laser diode or through the heat dissipation diode depending on the current flow direction in the drive circuit.

13 Claims, 3 Drawing Sheets

LASER ARRAY

BACKGROUND OF THE INVENTION

Laser printers and/or digital printing presses, for example dry toner laser printers and liquid electrophotographic (LEP) laser printers, to name a few, generally use a discharge area development (DAD) electrophotographic process in which light is used to selectively discharge electrical charge on a photoconductor to form a latent electrostatic image. Electrically charged toner or ink is then applied to the photoconductor and adheres to the photoconductor in either exposed or unexposed regions in which the electrical charge has been discharged but does not adhere to the unexposed or exposed regions, respectively, which have not been discharged. The adhered toner or ink is then transferred to a print medium such as paper and bonded onto the print medium.

Errors in the scan lines produced on the photoconductor can produce visible artifacts in the printed image on the print medium, which are undesirable. These errors may be caused, for example, by non-uniform exposure energy density for a particular region of photoconductor. The exposure density can be regarded as the product of the power density (normally measured in $mW/cm^2$) of the light incident on the photoconductor and the exposure time of the photoconductor by the light for that region of the photoconductor.

Thermal cross talk can negatively affect the power performance of lasers. Thermal cross talk can be illustrated by an example. When a certain laser remains in a "switched on" condition, while one or more surrounding lasers are switched from an "off" to an "on" condition (or vice-a-versa), the temperature of the die of the first laser can increase (or decrease) due to the dissipated heat of the surrounding lasers. This rise in temperature can cause a power decrease of the first laser. In general, changing temperature conditions of neighboring lasers, for example due to modulation, may cause undesired heat exchanges between the lasers, and in turn affect light intensities.

The effect of thermal cross talk is seen as an intrinsic characteristic of laser arrays. Thermal cross talk can become worse in laser arrays of relatively short wavelength, for example red lasers, for example under 700 nanometers. In infrared laser arrays of approximately 830 nanometers, light intensity is usually affected less than 10 percent, while for red lasers having wavelengths between approximately 630 and 670 nanometers, the intensity can be affected more than ten or even several tens of percent. In one explanation, due to the relatively low thermal conductivity, higher electrical resistance and higher voltage threshold of these types of lasers, more heat is dissipated in the laser die.

It may therefore be desired to limit thermal cross talk in laser arrays, and in laser arrays for electrophotographic printing.

BRIEF DESCRIPTION OF THE DRAWINGS

For the purpose of illustration, certain embodiments of the present invention will now be described with reference to the accompanying diagrammatic drawings, in which.

DETAILED DESCRIPTION

In the following detailed description, reference is made to the accompanying drawings. The embodiments in the description and drawings should be considered illustrative and are not to be considered as limiting to the specific embodiment of the element described. Multiple embodiments may be derived from the following description through modification, combination or variation of certain elements. Furthermore, it may be understood that also embodiments or elements that may not be specifically disclosed may be derived from the description and drawings.

Figure 1:
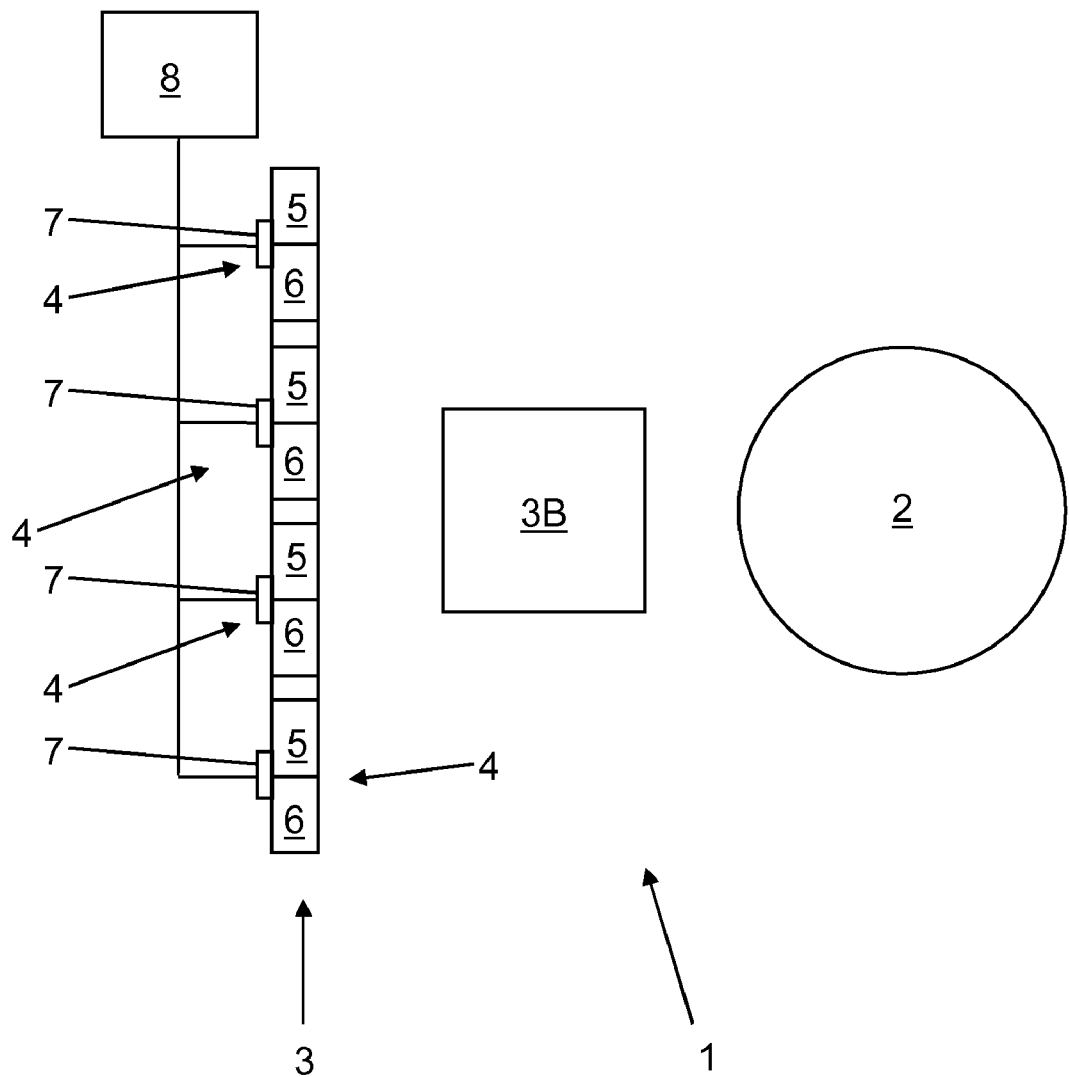
FIG. 1 shows a schematic diagram of a print system.

In FIG. 1, a print system 1 is illustrated. The print system 1 may comprise an electrophotographic print system. The print system 1 may comprise a Liquid Electrostatic or Liquid Electro-Photographic (LEP) or Dry Electro-Photographic (DEP) print system. The print system 1 may comprise a photosensitive medium 2. The photosensitive medium 2 may comprise a drum, or belt, or other suitable medium. The photosensitive medium 2 may be arranged to generate an electrostatic pattern on its surface, in accordance with input image data. The electrostatic pattern may be generated by partially or fully charging or discharging the surface by light of a certain wavelength.

A laser array 3 may be provided for charging or discharging the photosensitive surface. The laser array 3 may comprise a monolithic laser array. The laser array 3 may be adapted to alter the electrical potential of a region on the photosensitive medium 2. Optionally, an optical guide 3B may be provided for guiding the light emitted by the laser array 3 onto the photosensitive medium 2.

The print system 1 and its printing techniques may be similar to print systems and techniques as disclosed in U.S. Pat. Nos. 4,678,317; 4,860,924; 4,980,259; 4,985,732; 5,028,964; 5,034,778; 5,047,808; 5,078,504; 5,117,263; 5,148,222; 5,157,238; 5,166,734; 5,208,130; 5,231,454; 5,255,058; 5,266,435; 5,268,687; 5,270,776; 5,276,492; 5,278,615; 5,280,326; 5,286,948; 5,289,238; 5,315,321; 5,335,054; 5,337,131; 5,376,491; 5,380,611; 5,426,491; 5,436,706; 5,497,222; 5,508,790; 5,527,652; 5,552,875; 5,555,185; 5,557,376; 5,558,970; and 5,570,193, the contents of which are herein incorporated by reference. The print system 1 of this disclosure may comprise, or be similar to, an HP Indigo Digital Press®™.

The laser array 3 may comprise a plurality of laser assemblies 4. Each laser assembly 4 may comprise a laser diode 5 that is arranged to selectively emit light onto a region of the medium 2 according to the input image data signals. The laser diode 5 may emit light onto a moving photosensitive medium 2. By selectively switching the laser diodes 5 in the laser array 3 on and off according to certain input image patterns, corresponding "print" regions and background regions may be formed. The "print" regions of the photosensitive medium 2 may have a different electrical potential than the neighboring "background" regions. One or more inks may be adhered to the respective print regions. The medium 2 may transfer the one or more inks to an intermediate transfer member and/or directly to a substrate. Different print regions and different background regions may be formed on one photosensitive medium, or optionally multiple photosensitive media, corresponding to multiple colors, to the end of forming a halftone printed image on a substrate.

In an embodiment, print regions may be formed by illuminating the photosensitive region. In another embodiment, background regions may be formed by illuminating the respective photosensitive region.

The laser assembly 4 may further comprise a heat dissipation diode 6 corresponding to the laser diode 5. The heat dissipation diode 6 may have similar heat dissipation characteristics as the laser diode 5. The heat dissipated by the heat dissipation diode 6 and the laser diode 5 may be approximately constant. For example, the heat dissipation diode 6 may have approximately equal resistance properties as the laser diode 5. The heat dissipation may be similar over a similar amount of time, voltage and/or current.

The heat dissipation diode 6 may be arranged in relatively close proximity to the corresponding laser diode 5. For example, the heat dissipation diode 6 may be arranged closer to the corresponding laser diode 5 than a neighboring laser diode 5 in the laser array 3. The distance between the corresponding laser diode 5 and heat dissipating diode 6 may be such that the heat that is received by the neighboring laser diode 5 may be approximately constant irrespective of whether the laser diode 5 or its corresponding heat dissipating diode 6 is dissipating heat.

The laser assembly 4 may further comprise a drive circuit 7 arranged to conduct current to the respective laser diode 5 and the respective heat dissipation diode 6. The drive circuit 7 may be arranged to switch the polarity of the current to the laser assembly 4 for driving either the laser diode 5 or the heat dissipation diode 6, as will be explained below. In a specific embodiment, the drive circuit 7 may comprise a polarity switch. The drive circuits 7 may be arranged near each pair of a corresponding laser diode 5 and heat dissipation diode 6, or it may be arranged at a certain distance from the corresponding pair.

A control circuit 8 may be provided that may be arranged to activate the individual laser diodes 5 through the corresponding drive circuits 7, in accordance with input image data.

In another embodiment, the heat dissipation diode 6 may have a resistance and/or heat dissipation properties that are different from the resistance and/or heat dissipation properties of the laser diode 5. In such embodiment, for example, in addition to switching the current polarity, the current amplitude may be controlled so as to achieve heat dissipation equivalent to that of the laser. The drive circuit 7 may support and/or enable polarities at individually controllable amplitudes that may differ for each polarity.

Figure 2:
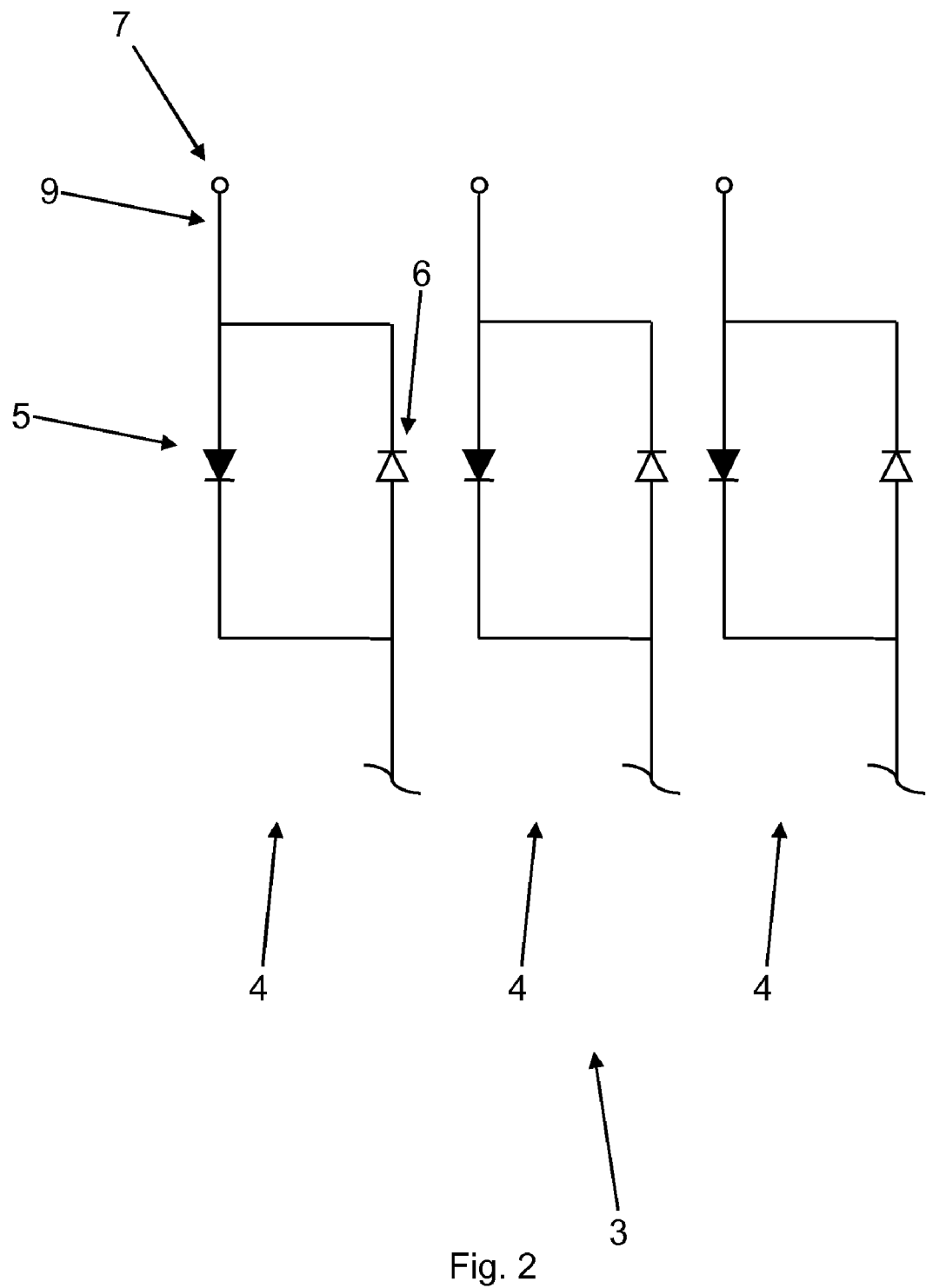
FIG. 2 shows a schematic circuit diagram of laser assemblies in a laser array.

In FIG. 2, individual laser assemblies 4 are shown schematically, wherein an incoming and outgoing electrical line is shown that may be connected to the control circuit 8. However, for the sake of illustration the electrical lines are cut off. The figure shows a part of the laser array 3 whereas different suitable configurations may be possible for connecting the laser assemblies 3 to the drive circuit 7, and the drive circuit to the control circuit 8, as the skilled person will understand.

Within the laser assembly 4, the laser diode 5 and the heat dissipation diode 6 may have an opposite polarity with respect to each other, as shown in FIG. 2. The diodes 5, 6 may be arranged in opposite polarity directions so that current may either flow through the laser diode 5 or through the heat dissipation diode 6, depending on the current flow direction in the drive circuit 7. For example, the laser diode 5 may have a cathode configuration, whereas the heat dissipation diode 6 may have an anode configuration. The circuit of the laser assembly 4 is such that current will flow through either the laser diode 5 or the heat dissipation diode 6. The control circuit 8 may be arranged to activate the individual laser diodes 5 by individually switching the polarity of the respective drive circuits 7, in correspondence with input image data.

The configuration of each laser assembly 4 may allow for the drive circuit 7 to comprise one electrical conducting line 9 that is connected to both the laser diode 5 and the heat dissipation diode 6. The electrical conducting line 9 may be arranged so that current flows through the laser diode 5 or the heat dissipation diode 6 depending on the current flow direction in the electrical conducting line 9. The conducting line 9 may comprise a trace, wire, or the like adapted to drive a laser diode 5. In an embodiment, the laser assembly 4 may be arranged such that the laser diode 5 and the heat dissipation diode 6 may be arranged on or connected to the same electrical conducting line. In a further embodiment, the driver circuit 7, the laser diode 5 and the heat dissipation diode 6 may be arranged on on the same electrical conducting line.

Complex and/or double wiring for driving the heat dissipation diodes 6 may be avoided because only one electrical conducting line may be connected to the control circuit 8 and the respective laser assemblies 4. The electrical conducting line may extend from the control circuit 8 to the drive circuit 7. Thus, with this solution separate lines between drive circuits 7 and respective heat dissipation diodes 6 may be avoided. One drive circuit 7 may be enough for driving both the laser diode 5 and the heat dissipation diode 6.

By switching the polarity via the drive circuit 7, the current in the laser assembly 4 may flow through either the laser diode 5 or the heat dissipation diode 6. The laser diode 5 and the heat dissipation diode 6 may dissipate an approximately equal heat amount when current flows through the laser assembly 4. Therefore, the laser assembly 4 may dissipate a relatively stable amount of heat when either the laser diode 5 or the heat dissipation diode 6 is switched on.

Normally, when a laser diode 5 is activated, it dissipates heat to its neighboring laser diodes 5. Turning on and off one or more laser diodes 5 may influence the temperature of one or more neighboring laser diodes 5, which in turn may affect intensity and/or the wavelength range of light emitted by these neighboring laser diodes 5. This effect may be referred to in the art as thermal cross talk.

According to an embodiment of this disclosure, when the laser diode 5 is de-activated, the corresponding heat dissipation diode 6 is activated. The heat dissipation diode 6 may dissipate an approximately equal amount of heat as the laser diode 5. When the laser diode 5 is activated, the heat dissipation diode 6 may be de-activated, wherein the laser diode 5 may dissipate an approximately equal amount of heat as the heat dissipation diode 6. Hence, irrespective of the laser diode 5 being activated, an approximately equal amount of heat may be dissipated to the respective neighboring laser diode 5. In this way, through de-activation of the laser diode 5, relatively high drops of temperature of a neighboring laser diode 5, and/or its light intensity and/or wavelength range may be prevented.

In the shown embodiment, switching on and off the laser diodes 5 automatically switches off and on, respectively, the heat dissipation diode 6, so that a relative temperature stability of the laser assemblies 4 may be achieved. The temperatures in the laser array 3 may be relatively controlled without needing complex algorithms for controlling the heat dissipation diodes 6 and/or without needing many interconnected wires.

Normally, at relatively short wavelengths, for example of below 700 nanometers, thermal cross talk may tend to be more severe than at longer wavelengths. However, as thermal cross talk may be prevented using the features as explained in this disclosure, it may be possible to employ short wavelength range laser diodes 5. In an embodiment, the laser diode 5 may be arranged to emit at a wavelength of between approximately 350 and approximately 850 nanometer. In a further embodiment, the laser diode 5 may be arranged to emit red light, for example between approximately 630 and 670 nanometer. In again a further embodiment, the laser diode 5 may be arranged to emit at a wavelength of between approximately 400 and approximately 700 nanometers. The laser array 3 may allow the emission power and wavelength of the respective laser diodes 5 to deviate less than approximately 10%, for example less than 3%, at any of the above mentioned powers and wavelengths.

Figure 3:
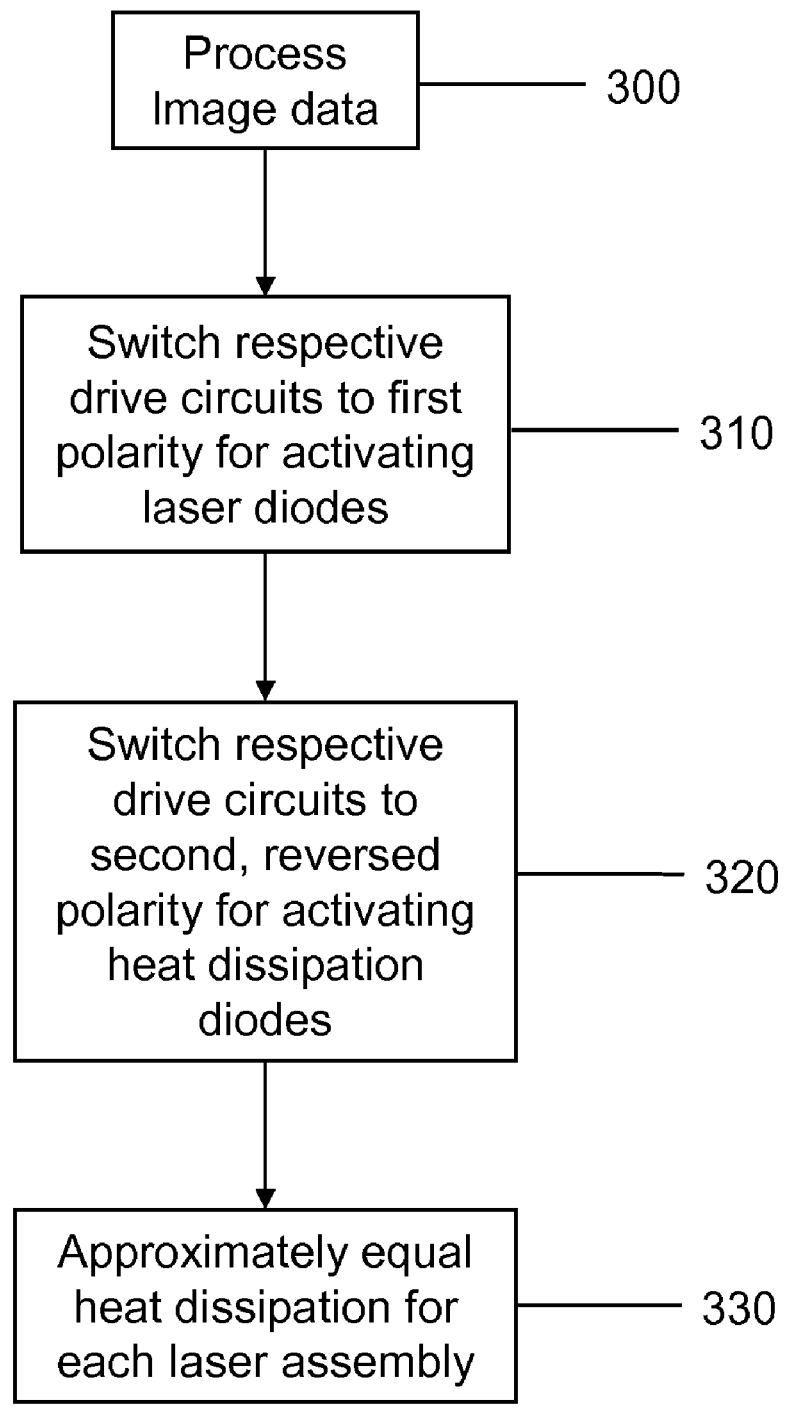
FIG. 3 shows a flow chart of a method of controlling light emission intensity onto a photosensitive medium.

A method of controlling light emission intensity onto a photosensitive medium may be explained, in steps, with reference to FIG. 3. First, image data may be processed for driving the laser array 3, in step 300. In accordance with this image data, the respective laser diodes 5 may be selectively activated, in step 310. Current may flow through the drive circuit 7 and through the laser diode 5 in a first direction and the concerning laser diode 5 may emit light onto a corresponding region of the photosensitive medium. In an embodiment, this corresponding region may be discharged.

In step 320, the respective laser diode 5 may be turned off, by switching a polarity in the drive circuit 7, in accordance with the input image data. Then, the current may flow through the same drive circuit 7 in a second direction that is opposite to the first direction, so that the current in the respective laser assembly 4 may then flow through the heat dissipation diode 6 corresponding to the laser diode 5.

The above steps 300-320 may allow for an approximately constant heat dissipation for each laser assembly 4 in time, while the laser diodes 5 in the neighboring laser assemblies 4 are continuously switched on or off, as indicated by step 330.

The above steps 300-320 may be repeated as the photosensitive medium 2 may move along the laser array 3 while print regions and background regions may be formed by respective laser diodes 5 being switched on and off. Ink may be transferred from an ink developer to the respective print regions. From there, the ink may be transferred to a substrate, for example directly or via an intermediate transfer member.

In the above description, it should be understood that "constant" or "equal" heat dissipation, or the like, should be understood as relative to a situation wherein fluctuations would occur. In fact, the heat dissipation of individual laser diodes 5 and individual heat dissipation diodes 6 may change over time. However, with the invention, disadvantageous temperature fluctuations in laser diodes 5 may be prevented, and relative emission power stability may be achieved.

In a first aspect, a laser array 3 may be provided. The laser array 4 may comprise a plurality of laser assemblies 4. The laser assembly 4 may comprise a laser diode 5, a corresponding heat dissipation diode 6, and a drive circuit 7. The drive circuit 7 may be arranged to conduct current to the respective laser diode 5 and heat dissipation diode 6. The laser diode 5 and the heat dissipation diode 6 may have similar heat dissipation properties. The laser diode 5 and the heat dissipation diode 6 may have an opposite polarity with respect to each other, within the laser assembly 4, so that current either flows through the laser diode 5 or through the heat dissipation diode 6, depending on the current flow direction in the drive circuit 7. The heat dissipation diode 6 may be arranged in close proximity to the corresponding laser diode 5 so that in use the laser assembly 4 dissipates an approximately constant amount of heat irrespective of the laser diode 5 or the heat dissipation diode 6 being switched on.

In a second aspect, an electrophotographic print system 1 may be provided. The electrophotographic print system 1 may comprise a photosensitive medium 2 and a laser array 3. The laser array 3 may be provided with a plurality of laser diodes 5 arranged to emit light onto the photosensitive medium 2 for varying an electrical potential on a surface of the photosensitive medium 2. The laser array 3 may further be provided with a plurality of heat dissipation diodes 6, each heat dissipation diode 6 being arranged in proximity to a corresponding laser diode 5. For example, a laser diode 5 may be arranged closer to its corresponding heat dissipation diode 6 than to a neighboring laser diode 5, so that the neighboring laser diode 5 may receive an approximately constant amount of heat from the laser diode 5 and its corresponding heat dissipation diode 6. Each laser diode 5 and the corresponding heat dissipation diode 6 may be coupled to a common drive circuit 7. The laser diode 5 and the heat dissipation diode 6 may be arranged in opposite current flow directions with respect to each other, so that in use the current flows either through the laser diode 5 or through the heat dissipation diode 6 depending on the current flow direction in the drive circuit 7.

In a third aspect, a method of controlling light emission intensity onto a photosensitive medium 2 may be provided. The method may comprise turning on a laser diode 5. The method may further comprise current flowing through, to, or from a drive circuit 7 and through the laser diode 5 in a first direction. The method may further comprise the laser diode 5 emitting light onto the photosensitive medium 2. The method may further comprise turning off the laser diode 5 by switching a polarity in the drive circuit 7. The method may further comprise current flowing through the drive circuit 7 in a second direction that is opposite to the first direction, and through a heat dissipation diode 6 corresponding to the laser diode 5 that is arranged in an opposite polarity with respect to the laser diode 5. The method may further comprise the assembly of the laser diode 5 and the heat dissipation diode 6 dissipating a relatively constant amount of heat before and after switching the polarity.

The above description is not intended to be exhaustive or to limit the invention to the embodiments disclosed. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, while a reference to a certain number of elements does not exclude the possibility of having more elements. A single unit may fulfil the functions of several items recited in the disclosure, and vice versa several items may fulfil the function of one unit.

The mere fact that certain measures are recited in mutually different dependent claims does not indicate that a combination of these measures cannot be used to advantage. Multiple alternatives, equivalents, variations and combinations may be made without departing from the scope of the invention.

The invention claimed is:

1. Laser array, comprising a plurality of laser assemblies, the laser assembly comprising a laser diode, a corresponding heat dissipation diode, and a drive circuit arranged to conduct current to the respective laser diode and heat dissipation diode, wherein the laser diode and the heat dissipation diode have an opposite polarity with respect to each other within the laser assembly, so that current either flows through the laser diode or through the heat dissipation diode, depending on the current flow direction in the drive circuit, and the heat dissipation diode is arranged in close proximity to the corresponding laser diode so that in use the laser assembly dissipates an approximately equal amount of heat irrespective of the laser diode or the heat dissipation diode being switched on.

2. Laser array according to claim 1, wherein the laser diode and the heat dissipation diode have similar heat dissipation properties.

3. Laser array according to claim 1, the drive circuit is arranged to reverse its polarity, so that in a first polarity current flows through the laser diode and in a second polarity current flows through the heat dissipation diode.

4. Laser array according to claim 1, wherein the drive circuit comprises one electrical conducting line that is connected to both the laser diode and the heat dissipation diode, the line being arranged so that current flows through the laser diode or the heat dissipation diode depending on the current flow direction in the line.

5. Laser array according to claim 4, wherein the laser diode and the heat dissipation diode extend on the same electrical conducting line.

6. Laser array according to claim 1, wherein each laser diode is arranged to emit at a wavelength of between approximately 350 and approximately 850 nanometer.

7. Laser array according to claim 1, wherein each laser diode is arranged to emit at a wavelength of between approximately 400 and approximately 700 nanometer.

8. Laser array according to claim 1, comprising a monolithic laser array.

9. Electrophotographic print system, comprising
a photosensitive medium, and
a laser array being provided with
  a plurality of laser diodes arranged to emit light onto the photosensitive medium for varying an electrical potential on a surface of the photosensitive medium, and
  a plurality of heat dissipation diodes, each heat dissipation diode being arranged in proximity to a corresponding laser diode,
wherein each laser diode and the corresponding heat dissipation diode are coupled to a common drive circuit and are arranged in opposite current flow directions with respect to each other, so that in use the current flows either through the laser diode or through the heat dissipation diode depending on the current flow direction in the drive circuit.

10. Electrophotographic print system according to claim 9, comprising a control circuit arranged to individually switch the polarity of the respective drive circuits.

11. Method of controlling light emission intensity onto a photosensitive medium, comprising
  turning on a laser diode,
  current flowing through a drive circuit and through the laser diode in a first direction,
  the laser diode emitting light onto the photosensitive medium,
  turning off the laser diode by switching a polarity in the drive circuit,
  current flowing through the drive circuit in a second direction that is opposite to the first direction, and through a heat dissipation diode corresponding to the laser diode that is arranged in an opposite polarity with respect to the laser diode, and
  the assembly of the laser diode and the heat dissipation diode dissipating a relatively constant amount of heat before and after switching the polarity.

12. Method according to claim 11, comprising the heat dissipation diode and the laser diode each dissipating a similar amount of heat when being switched on.

13. Method according to claim 11, comprising
  processing input image data,
  moving the photosensitive medium with respect to the laser diode,
  turning on and off the laser diode for forming print regions and background regions on the photosensitive region,
  transferring ink to the print regions, and
  transferring the ink from the respective print regions to a substrate.

\* \* \* \* \*